(12) United States Patent
Abramovici et al.

(10) Patent No.: US 6,973,608 B1
(45) Date of Patent: Dec. 6, 2005

(54) FAULT TOLERANT OPERATION OF FIELD PROGRAMMABLE GATE ARRAYS

(75) Inventors: Miron Abramovici, Berkeley Heights, NJ (US); John M. Emmert, Dayton, OH (US); Charles E. Stroud, Charlotte, NC (US)

(73) Assignees: Agere Systems Inc., Allentown, PA (US); University of North Carolina at Charlotte, Charlotte, NC (US)

( * ) Notice: Subject to any disclaimer, the term of this patent is extended or adjusted under 35 U.S.C. 154(b) by 535 days.

(21) Appl. No.: 10/189,640

(22) Filed: Jul. 3, 2002

Related U.S. Application Data (60) Provisional application No. 60/303,534, filed on Jul. 6, 2001.

(51) Int. Cl.$^7$ .............................................. G06F 11/00
(52) U.S. Cl. ......................................... 714/725; 714/5
(58) Field of Search .................. 714/13, 7, 5, 724–725, 714/30–31, 42, 733–735, 736–737; 326/10, 326/37–38

(56) References Cited

U.S. PATENT DOCUMENTS

| | | | | |
|---|---|---|---|---|
| 5,081,297 A | * | 1/1992 | Lebel et al. ................. | 710/104 |
| 5,090,015 A | * | 2/1992 | Dabbish et al. ............. | 714/733 |
| 5,121,394 A | * | 6/1992 | Russell ........................ | 714/724 |
| 5,623,501 A | * | 4/1997 | Cooke et al. ................ | 714/725 |

OTHER PUBLICATIONS

A. Steininger and Scherer, "On the Necessity of On-Line BIST in Safety Critical Applications," Proc. 29th Fault-Tolerant Computimg Symp, pp. 208-215, 1999.

M. Renovell, J. Portal, J. Figueras, and Y. Zorian, "Testing the Interconnect of RAM-Based FPGA," Proc. IEEE Design & Test of Computers, vol. 15, No. 1, pp. 45-50, 1998.

S. Dutt and F. Hancheck, "REMOD: A New Methodology for Designing Fault-Tolerant Arithmetic Circuits," IEEE Trans. on VLSI Systems, vol. 5, pp. 34-56, 1997.

S. Dutt, et al., "Efficient Incremental Rerouting for Fault Reconfiguration in Field Programmable Gate Arrays," ACM/IEEE Int'l Conf. on Computer Aided Design, 1999.

(Continued)

*Primary Examiner*—Dieu-Minh Le
(74) *Attorney, Agent, or Firm*—King & Schickli, PLLC (57) ABSTRACT

A method of fault tolerant operation of field programmable gate arrays (FPGAs), whether as an embedded portion of a system-on-chip or other application specific integrated circuit, utilizing incremental reconfiguration during normal on-line operation includes configuring an FPGA into a self-testing area and a working area. Within the self-testing area, programmable interconnect resources of the FPGA are tested for faults. Upon the detection of one or more faults within the interconnect resources, the faulty interconnect resources are identified and a determination is made whether utilization of the faulty interconnect resources is compatible with an intended operation of the FPGAs. If the faulty interconnect resources are compatible with the intended operation of the FPGA, utilization of the faulty interconnect resource is allowed to provide fault tolerant operation of the FPGA. If the faulty interconnect resources are not compatible with the intended operation of the FPGA, on the other hand, a multi-step reconfiguration process may be initiated which attempts to minimize the effects of each reconfiguration on the overall performance of the FPGA. In an alternate embodiment, the entire FPGA may be configured as one or more self-testing areas during off-line testing, such as manufacturing testing.

36 Claims, 4 Drawing Sheets

OTHER PUBLICATIONS

J. Emmert and D. Bhatia, "Partial Reconfiguration of FPGA Mapped Designs with Applications to Fault Tolerance and Yield Enhancement", Lecture Notes on Comp. Sci., vol. 1304, pp. 141-150, 1997.

J. Emmert and D. Bhatia, "A Fault Tolerant Technique for FPGAs", Journal of Electronic Testing, vol. 16, pp. 591-606, 2000.

F. Hanchek and S. Dutt, "Methodologies for Tolerating Logic and Interconnect Faults in FPGAs," IEEE Trans.on Computers, pp. 15-33, 1998.

J. Lach, et al., "Low Overhead Fault-Tolerant FPGA Systems," IEEE Trans. on VLSI Systems, vol. 6, No 2, pp. 212-221, 1998.

J. Lach, et al., "Algorithms for Efficient Runtime Fault Recovery on Diverse FPGA Architectures," Proc. Int'l. Symp. on Defect and Fault Tolerance In VLSI Systems, 1999.

N. Mahapatra and S. Dutt, "Efficient Network Flow Based Technique for Dynamic Fault Reconfiguration in FPGAs", Proc. Fault Tolerant Computing Symp., pp. 122-129, 1999.

C. Stroud, S. Wijesuriya, C. Hamilton, and M. Abramovici, "Built-In Self-Test of FPGA Interconnect," Proc. Intn'l. Test Conf., pp. 404-411, 1998.

I. Harris and R. Tessier, "Interconnect Testing in Cluster-Based FPGA, Architectures", Proc. AMC/IEEE Design Automation Conf., 2000.

I. Harris and R. Tessier, "Diagnosis of Interconnect Faults in Cluster-Based FPGA Architectures", Proc. IEEE Intn'l Conf. on Computer Aided Design, 2000.

M. Abramovici, et al., "Using Roving STARs for On-Line Testing and Diagnosis of FPGAs in Fault-Tolerant Applications," Proc. IEEE Intn'l. Test Conf., pp. 973-982, 1999.

M. Abramovici, et al., "Improving On-Line BIST-Based Diagnosis for Roving STARs," Proc. IEEE Intn'l On-Line Testing Workshop, 2000.

K. Roy and S. Nag, "On Routability for FPGAs Under Faulty Conditions," IEEE Trans on Computers, vol. 44, pp. 1296-1305, 1995.

Vijay Lakamraju and Russell Tessier, "Tolerating Operational Faults in Cluster-based FPGAs," Proc. ACM Intn's Symposium on FPGAs, pp. 187-194, 2000.

C. Zeng; N. Saxena; and E. McCluskey, "Finite State Machine Synthesis with Concurrent Error Detection," Proc. IEEE Int'l Test Conf., 1999, pp. 672-6789.

F. Lombardi; D. Ashen, X. Chen; and W.K. Huang, "Diagnosing Programmable Interconnect Systems for FPGAs," Proc. ACM/SIGDA Intn'l Symp. on FPGAs, pp. 100-106, 1996.

J. Emmert and D. Bhatia, "Incremental Routing in FPGAs", Proc. IEEE Int'l. ASIC Conf., pp. 302-305, 1998.

* cited by examiner

FAULT TOLERANT OPERATION OF FIELD PROGRAMMABLE GATE ARRAYS

This application claims the benefit of U.S. Provisional Application No. 60/303,534, filed Jul. 6, 2001.

This invention was made with Government support under contract number F33615-98-C-1318. The Government has certain rights in this invention.

TECHNICAL FIELD

The present invention relates generally to the field of integrated circuit devices and, more particularly, to fault tolerant operation of field programmable gate arrays.

BACKGROUND OF THE INVENTION

A field programmable gate array (FPGA), whether alone, or forming an embedded portion of a system-on-chip or other application specific integrated circuit, is a type of integrated circuit consisting of an array of programmable logic blocks interconnected by a programmable interconnect or routing network and programmable input/output cells. Programming of the logic blocks, the interconnect resources which make up the network, and the input/output cells is selectively completed to make the necessary interconnections that establish one configuration thereof to provide the desired system operation/function for a particular application.

The present inventors have recently developed off-line methods of built-in self-testing the array of programmable logic blocks and the programmable interconnect resources in FPGAs at the device, board and system levels. These methods are set out in detail in U.S. Pat. Nos. 5,991,907, 6,003,150, 6,108,806, and 6,202,182. The full disclosures in these patents are incorporated herein by reference.

In addition to these off-line testing methods, the present inventors have also recently developed methods of testing programmable logic blocks and interconnect resources and identifying faulty programmable logic blocks and interconnect resources during normal on-line operation of the FPGAs, and fault tolerant operation of the programmable logic blocks. These testing, identifying, and operating methods are set out in detail in U.S. Pat. Nos. 6,256,758, 6,550,030, 6,631,487, 6,574,761, and 6,530,049 and in pending U.S. application Ser. No. 09/994,299. The full disclosures in these patents and patent application are also incorporated herein by reference.

On-line testing and fault tolerant operation of FPGAs is most important in high-reliability and high-availability applications, such as, long-life space missions, telecommunication network routers, or remote equipment in which adaptive computing systems often rely on reconfigurable hardware to adapt system operation to environment changes. In such applications, the FPGA hardware must work continuously and simply cannot be taken off-line for testing, maintenance, or repair.

When faults are detected in the programmable interconnect resources of the FPGA hardware of these systems, the faulty interconnect resources must be quickly identified in order to facilitate efficient reconfiguration of the remaining FPGA resources to avoid the faulty interconnect resources, or preferably to reuse the faulty interconnect resources for fault-tolerant operation of the FPGA. Accordingly, a need is identified for an efficient and adaptive method of determining the compatibility of faulty programmable interconnect resources with intended system operation and reconfiguring the FPGA resources to avoid the faulty interconnect resources, if required. These methods may be performed concurrently with normal system operation or during manufacturing testing.

SUMMARY OF THE INVENTION

We have recognized that a need exists to extend the lifetime of a critical mission without increasing the number of available parts. For a field programmable gate array, a part is any one of its programmable interconnect resources including wires and configurable or configuration interconnect points. Since programmable interconnect resources of a field programmable gate array may be utilized in many configurations during operation, it is likely that a fault would affect only some of these configurations, and may allow still more configurations to be utilized. Accordingly, the faulty interconnect resource may still be able to properly function in the operational configurations not affected by the fault. It necessarily follows that if the remaining useful operational configurations or the newly available configurations which utilize the partially faulty resource match an intended operational configuration for that resource, the partially faulty resource may continue to be utilized as if it were fault free. Advantageously, this approach to resource utilization provides for a more gradual degradation of field programmable gate array hardware, whether alone, or forming an embedded portion of a system-on-chip or other application specific integrated circuit, thus extending the useful life of the system.

In accordance with the present invention, a method of fault tolerant operation of a field programmable gate array (FPGA) may be carried out during normal on-line operation and/or during off-line testing, for example, during manufacturing testing. The FPGA resources are configured into a working area and a self-testing area. The working area maintains normal operation of the FPGA throughout on-line testing. During manufacturing testing, the working area may be replaced with additional self-testing areas or the self-testing area extended to include the entire FPGA. It should be noted that the same fault tolerant techniques described hereinafter for on-line testing may be used in part or in whole during off-line testing prior to re-programming or re-configuring the FPGA for normal operation.

Within the self-testing area, the programmable interconnect resources are tested for faults and faulty interconnect resources identified. Once identified, a determination is made whether the faulty programmable interconnect resources are compatible with normal system operation. If the faulty interconnect resources are not compatible, the FPGA resources are reconfigured to avoid the faulty interconnect resources. It is initially presumed that all of the resources of the FPGA are fault-free as determined through manufacturing testing.

To test the programmable interconnect resources in the preferred embodiment of the invention, test patterns are generated and applied to programmable interconnect resources selected for testing. Outputs of a first group of selected programmable interconnect resources, or wires under test, are preferably compared to outputs of a second group of wires under test. Based on a comparison of the outputs of the groups of wires under test, fault status data is generated. When the fault status data indicates the detection of a fault within the groups of wires under test, the groups of wires under test may be repeatedly reconfigured and further tested until the faulty resource(s) is identified. In some scenarios, however, the ability to identify a single resource as being faulty may be hindered by the placement of the fault or the existence of multiple faults. In these scenarios, a small group of interconnect resources may be identified as being faulty.

In accordance with a first aspect of the present inventive method, a determination is made whether the utilization of the programmable interconnect resources identified as being faulty is compatible with an intended operation of the FPGA. If a determination is made that the faulty resources are compatible with an intended operation of the FPGA, then the faulty resources continue to function in a diminished, although acceptable, capacity for specific operating modes. Advantageously, this type of on-line fault tolerance provides for a more gradual degradation of the FPGA over prior known test methods whose primary goal is simply to bypass any faulty resources.

If a determination is made that the faulty resources are not compatible with the intended operation of the FPGA, then the FPGA, or more specifically, the signal paths containing the identified faulty resources are reconfigured to bypass the faulty interconnect resource for continued operation in a diminished capacity. It should be noted that during off-line testing, identified faulty resources may simply be marked as faulty in order to avoid future use. In scenarios where more than one faulty resource is identified, a model of the programmable interconnect network is modified to reflect the faulty status of the incompatible faulty resource before determining the compatibility of subsequent faulty resources. In other words, the steps of determining compatibility and modifying the model of the programmable interconnect network are repeated until the compatibility of each of the identified faulty resources is determined.

As briefly mentioned above, a controller then initiates a multi-step reconfiguration process which attempts to minimize the effect of each reconfiguration on the overall performance of the FPGA. First, the controller determines whether the faulty resources are local interconnect resources, i.e., programmable interconnect resources connecting other interconnect resources to an input or output of a programmable logic block. If the faulty resources are local interconnect resources, the controller attempts to reconfigure the logic or function of the affected programmable logic blocks and re-route the faulty signal path to connect the faulty signal path with a different input or output of the affected programmable logic block. If the controller is unable to reconfigure the affected programmable logic block function and re-route the faulty signal path or if the faulty resources are not local routing resources, then the controller attempts to incrementally re-route the faulty signal paths that are affected by an incompatible fault without changing other non-affected signal paths. This may be accomplished using programmable interconnect resources of the faulty signal path not utilized in a dummy signal path described below, and unused interconnect resources, or unused programmable logic blocks as route throughs, to enhance routability during this step. In addition, the controller reconfigures the faulty resources to be unutilized during subsequent operation of the FPGA. More specifically, dummy signal paths are created by the controller which include the faulty resources and each of the interconnect resources between the faulty resource, and a point of intersection in the programmable interconnect network, or an input or output of the FPGA. The dummy signal paths are unavailable for subsequent utilization by the FPGA.

Once the affected signal paths are re-routed to avoid the identified faulty resource(s) and dummy signal paths created, compatibility of the re-routed signal with each self-testing area position is determined. If the re-routed signal paths are compatible, then fault tolerant reconfiguration is stopped at this step.

If the re-routed signal paths are not compatible or re-routing was unable to be accomplished, then the remaining unrouted faulty signal paths and additional signal paths routed through a region of the FPGA are re-routed around the faulty programmable interconnect resources utilizing programmable interconnect resources and programmable logic blocks positioned within the region and not utilized in the dummy signal paths. If all of the remaining faulty signal paths and additional signal paths routed through the region of the FPGA are not unsuccessful, then the size of the region is incrementally increased and the controller again attempts to re-route the remaining unrouted faulty signal paths and additional signal paths routed through the region. These steps may be repeated until each of the remaining faulty signal paths are successfully re-routed or the region of the FPGA includes substantially all of the resources of the working area of the FPGA.

In accordance with another aspect of the present invention, the function of programmable logic blocks attached to the remaining faulty signal paths may be re-assigned to unused programmable logic blocks and the remaining faulty signal paths may be re-routed around the faulty interconnect resources utilizing the unused programmable logic blocks, and interconnect resources not utilized in the at least one dummy signal path, if the re-routed signal paths described in the preceding paragraph are not compatible or re-routing was unable to be accomplished. Again, these steps may be repeated until each of the remaining faulty signal paths are successfully re-routed or all possible re-assignments have been exhausted.

If all of the remaining faulty signal paths and additional signal paths routed through the region of the FPGA are not successfully re-routed utilizing re-assignments, then the size of the region may be incrementally increased and the controller again attempts to re-assign and re-route the remaining unrouted faulty signal paths and additional signal paths routed through the region. These steps may be repeated until each of the remaining faulty signal paths are successfully re-routed utilizing re-assignments or the region of the FPGA includes substantially all of the resources of the working area of the FPGA.

In still another aspect of the present invention, at least a portion of the function of the FPGA may be re-mapped by the controller. More specifically, a region of the FPGA which includes all of the programmable logic blocks attached to the remaining faulty signal paths and additional signal paths passing through the region is re-mapped by the controller utilizing programmable interconnect resources and programmable logic blocks positioned within the region and not utilized in the dummy signal paths. Again, if all of the remaining faulty signal paths and additional signal paths routed through the region of the FPGA are not successfully re-mapped, then the size of the region is incrementally increased and the controller again attempts to re-route the remaining unrouted faulty signal paths and additional signal paths routed through the region. These steps may be repeated until each of the remaining faulty signal paths are successfully re-mapped or the region of the FPGA includes substantially all of the resources of the working area of the FPGA.

In accordance with another aspect of the present invention, the controller may utilize programmable interconnect resources and/or programmable logic blocks of the FPGA positioned within the self-testing area to assist the re-routing of the remaining faulty signal paths if all of the remaining faulty signal paths have not been successfully re-routed around the faulty interconnect resources at this point. Although utilizing the resources in the self-testing area for continued operation of the FPGA diminishes the ability of the self-testing area to test, and identify faulty resources, this approach allows the FPGA to continue to operate although in a diminished capacity.

In accordance with another aspect of the present invention, the self-testing area of the FPGA may be reconfigured so that a portion of the working area becomes a subsequent self-testing area, and at least a portion of the initial self-testing area becomes a portion of the working area once the resources in the self-testing area are tested, faulty resources are identified and their compatibility determined, and the resources in the self-testing area reconfigured, if required. In other words, the self-testing area may rove around the FPGA repeating the steps of testing, identifying, and determining the compatibility of faulty interconnect resources within the self-testing area while normal operation of the FPGA continues within the working areas uninterrupted by the activities conducted within the roving self-testing area.

In still another aspect of the invention, the controller may configure the FPGA so that the self-testing area includes two or more independent roving self-testing areas. In this manner, the steps of determining whether utilization of the faulty interconnect resources is compatible with the intended operation of the FPGA and reconfiguration of the interconnect resources including the utilization of the faulty interconnect resources may be performed prior to a subsequent roving step of a first of the independent self-testing areas wherein the faulty programmable interconnect resources are identified, while the remaining independent self-testing area may continue the steps of roving, testing, identifying and determining the compatibility of faulty interconnect resources within the self-testing area until another faulty interconnect resource is identified.

In accordance with another aspect of the present invention, the controller may allocate programmable interconnect resources as spares which may be utilized by the controller in any of the re-routing steps. This type of spare allocation is accomplished in the preferred embodiment, by routing spare signal paths between inputs and outputs of programmable logic blocks allocated as spares and substantially evenly distributed throughout the FPGA.

As indicated above, the present method of fault tolerant operation of FPGAs may be applied to an FPGA forming an embedded portion of a system-on-chip or other application specific integrated circuit. In this manner, on-line testing and fault tolerant operation of the embedded FPGA portion of the system-on-chip or other application specific integrated circuit may be facilitated. Furthermore, the present method may be extended to off-line applications of FPGAs, as described above, including embedded FPGAs, by re-programming the FPGA to include solely self-testing area(s) for test and diagnosis of faults as disclosed in the above-referenced pending U.S. patent application Ser. No. 09/994, 299. Once faulty resources have been identified, the fault tolerant methods of operation described herein may be applied as described to any portion, or all, of the FPGA whether embedded or alone.

An apparatus for supporting fault tolerant on-line operation of a FPGA includes a controller in communication with the FPGA for: (a) configuring the FPGA into a self-testing area and a working area, the working area maintaining normal operation of the FPGA; (b) initiating the identification of at least one faulty programmable interconnect resource utilized in at least one of a plurality of signal paths and positioned within said self-testing area; (c) determining whether utilization of said at least one identified faulty resource is compatible with an intended operation of the FPGA; and (d) reconfiguring at least a portion of the programmable interconnect resources including the utilization of said at least one faulty programmable interconnect resource if the at least one faulty programmable interconnect resource is not compatible with the intended operation of the FPGA. The testing apparatus may further include a storage medium in communication with the controller for storing a model of the programmable interconnect network. In accordance with another aspect of the present invention, the controller may modify the model of the programmable interconnect network if the at least one faulty programmable interconnect resource is determined to be incompatible with the intended operation of the FPGA prior to determining whether utilization of a next identified faulty resource is compatible with an intended operation of the FPGA.

BRIEF DESCRIPTION OF THE DRAWINGS

The accompanying drawings incorporated in and forming a part of the specification, illustrate several aspects of the present invention and together with the description serve to explain the principles of the invention. In the drawings.

Reference will now be made in detail to the present preferred embodiment of the invention, an example of which is illustrated in the accompanying drawings.

DETAILED DESCRIPTION OF THE INVENTION

A typical field programmable gate array (FPGA) generally consists of a plurality of resources including an array of programmable logic blocks (PLBs) interconnected by a programmable interconnect network, and programmable input/output cells or boundary scan ports (most FPGAs feature a boundary-scan mechanism). Such structures are, for example, featured in Lattice Semiconductor Corporation's ORCA Series FPGAs, in the Xilinx VIRTEX Series FPGAs, and in the Altera FLEX 8000 logic devices. In accordance with the present inventive method, programmable interconnect resources which make up the interconnect network of an FPGA under test 10 are tested for faults and faulty interconnect resources identified in order to determine whether the faults are compatible with the intended operation of the FPGA under test 10 or whether reconfiguration of the FPGA under test 10 during normal on-line operation is required.

Figure 1:
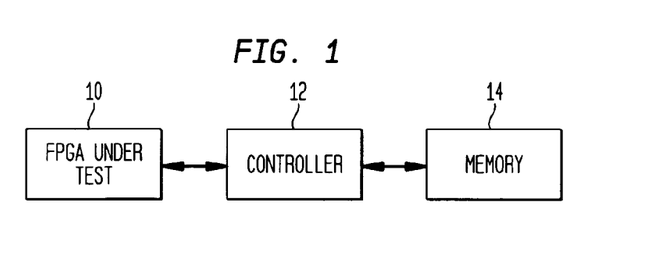
FIG. 1 is a schematic block diagram of an apparatus for testing resources of a field programmable gate array (FPGA)

As shown in schematic block diagram in FIG. 1, the present method of fault tolerant operation is preferably controlled by a test and reconfiguration controller 12. Most preferably, an external test and reconfiguration controller 12 is utilized because present commercially available FPGAs do not provide internal access to their configuration memory. Accordingly, a configuration decompiler tool of a type known in the art is utilized to determine the intended function or mode of operation of the FPGA resources. Alternatively, this information may be extracted from the design stage and made available to the controller 12. It should be appreciated by those skilled in the art that any controller, e.g., internal or external to an FPGA, could be utilized with an FPGA that allows for internal access to its configuration memory and that a single test and reconfiguration controller is capable of controlling several FPGAs. For purposes of illustration of the present preferred embodiment of the invention, however, a one-to-one controller to FPGA ratio is utilized.

Figure 2:
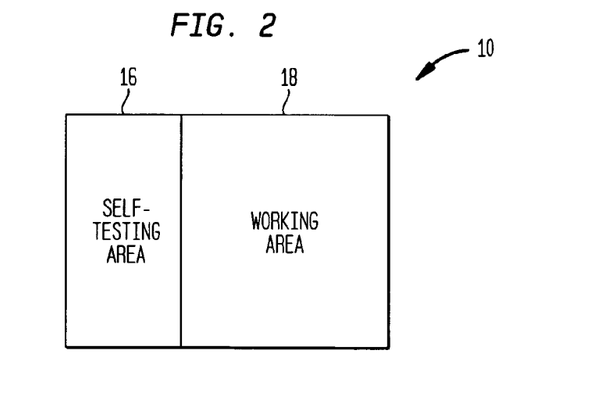
FIG. 2 is an illustration of an FPGA under test configured into a self-testing area and a working area which maintains normal operation of the FPGA under test.

The preferred controller 12 may be implemented on an embedded microprocessor in communication with a storage medium or memory 14 for storing the various FPGA operational and test configurations, as well as, fault status data for the FPGA resources. In operation, the controller 12 accesses the FPGA under test 10 using its boundary-scan interface in a known manner such that access is transparent to normal function of the FPGA 10. Initially, the controller 12 uses the boundary-scan interface to configure the FPGA resources for testing, to initiate testing of the FPGA resources, and to scan out the test results. As shown in FIG. 2, the FPGA under test 10 is initially configured by the controller 12 into a self-testing area 16 and a working area 18. In accordance with an important aspect of the present invention, normal operation of the FPGA under test 10 is maintained within the working area 18 while the programmable interconnect resources are tested and faulty resources identified in the self-testing area 16. During manufacturing testing, however, the working area may be replaced with additional self-testing areas or the self-testing area extended to include the entire FPGA.

Figure 3:
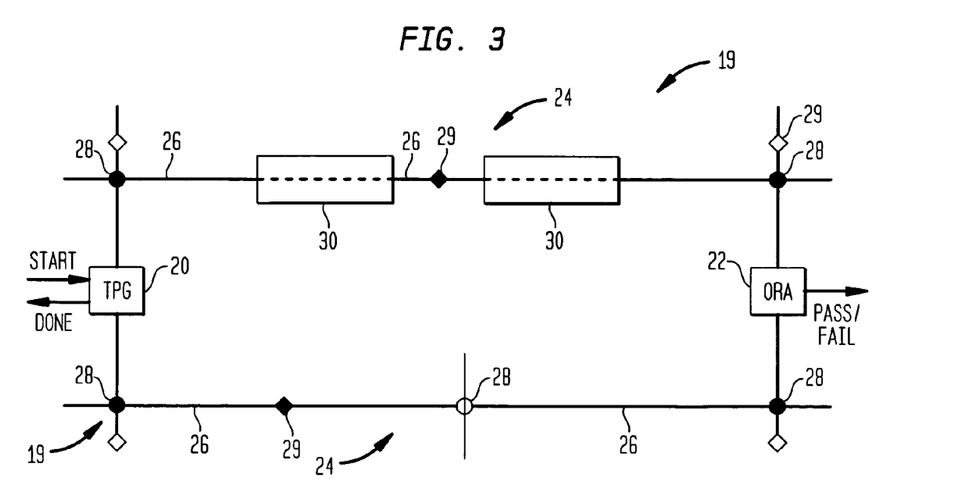
FIG. 3 is an illustration showing a preferred comparison-based tester configured to include a test pattern generator, an output response analyzer, and two groups of wires under test.

Testing of the FPGA 10 in the present preferred embodiment is generally accomplished by configuring its resources within the self-testing area 16 to function as a test pattern generator (TPG) 20 and an output response analyzer (ORA) 22, and as groups of interconnect resources or wires under test (WUTs) 24 as shown in FIG. 3. During testing, an exhaustive set of equivalent test patterns generated using the TPG 20 is applied to and propagated along the groups of WUTs 24. Most preferably, the TPG 20 utilized to generate the exhaustive set of test patterns is configured as an n-bit counter. The groups of WUTs 24 may include wires 26, configurable or configuration interconnect points (CIPs) including cross point CIPs 28 for connecting wire segments located in disjoint planes and break-point CIPs 29 for connecting wire segments in the same plane, and programmable logic blocks (PLBs) 30. Preferably the groups of WUTs 24 initially extend along the entire length of the self-testing area 16.

Outputs of the groups of WUTs 24 are compared by the ORA 22 to determine whether a fault exists within either of the groups of WUTs 24. A match/mismatch result of the comparison performed by the ORA 22 is communicated as a pass/fail result or fault status data through the boundary-scan interface of the FPGA under test to the controller 12. The fault status data is stored in memory 14 and utilized initially by the controller 12 in reconfiguring the FPGA resources for further testing.

Figure 4:
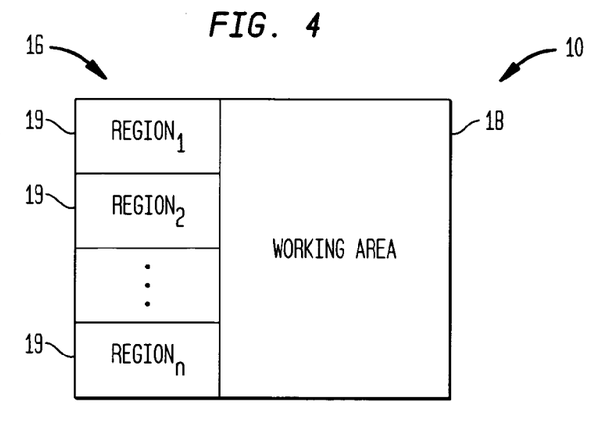
FIG. 4 is an illustration of an FPGA under test with an initial self-testing area divided into n testing regions.

In order to minimize the number of reconfigurations required during testing and therefore the total testing time, the FPGA resources within the self-testing area 16 are preferably configured to include several testers 19 each including at least a TPG 20, an ORA 22, and two groups of WUTs 24 as shown in FIG. 4. Comparative testing of the interconnect resources within each tester 19 is conducted concurrently as described above. The present preferred comparison-based on-line method of testing the programmable interconnect resources briefly described herein, including the fault model utilized and configuration of the self-testing area, is described in detail for programmable interconnect resources in the above-referenced pending U.S. application Ser. No. 09/406,219 and in C. Stroud ET AL., *Built-In Self-Test of FPGA Interconnect*, PROC. INTN'L TEST CONF., at 404–411, 1998 incorporated herein by reference. In accordance with the broad teachings of the present invention, the method may target permanent faults that exist in a newly manufactured FPGA device or which appear during the lifetime of the FPGA under test.

When the fault status data indicates the detection of a fault in one of the testers 19 in the self-testing area 16, roving of the self-testing area 16 is temporarily interrupted. In other words, the controller 12 stops or parks the self-testing area 16 over the tester 19 suspected of containing the faulty interconnect resource(s). In this manner, the faulty interconnect resource(s) may be identified, compatibility of the faulty resource with the intended function of the FPGA determined, and bypassing of the faulty resource accomplished, if required, while normal operation of the FPGA under test 10 continues in the working area 18.

Figure 5:
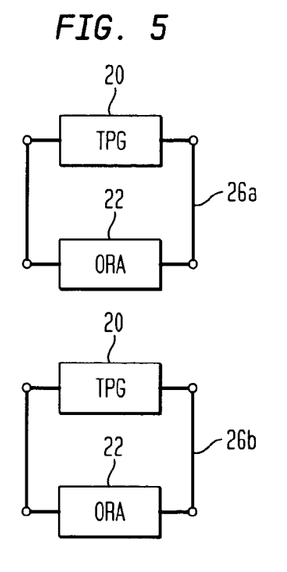
FIG. 5 is a schematic block diagram of two testers each including a subdivided portion of FPGA resources of a group of wires under test.
Figure 6:
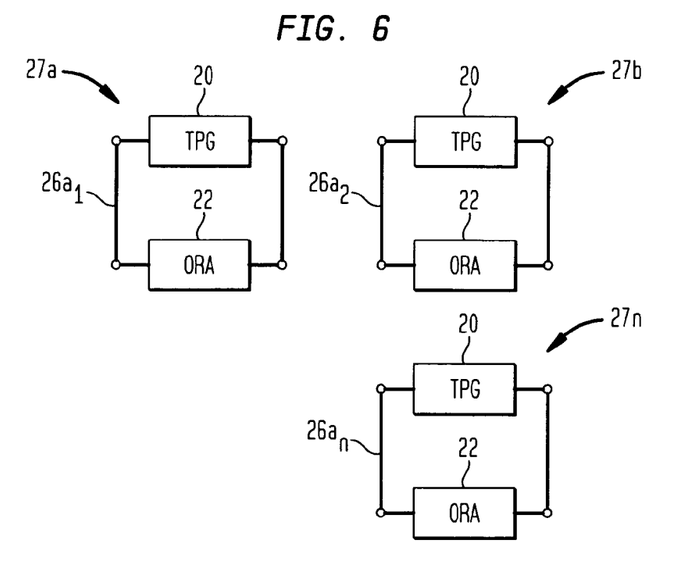
FIG. 6 is a schematic block diagram of n comparison based testing regions each including a wire of a group of wires under test which includes a faulty interconnect resource.

Within the self-testing areas 16, the resources of the FPGA under test 10 are reconfigured for further testing in order to identify the faulty programmable interconnect resource(s). Once a group of WUTs 26 is identified as including a faulty programmable interconnect resource, the resources of the FPGA under test 10 within the self-testing area 16 are reconfigured for further testing in order to minimize a region of the group of WUTs 26 which includes the faulty interconnect resource. Preferably, the group of WUTs 26 containing the faulty resource is reconfigured into subsequent groups of WUTs 26a and 26b as shown in FIG. 5 for further comparative testing. Dependent upon the subsequent fault status data, the interconnect resources within one or both of the subsequent groups of WUTs 26a, 26b may be further reconfigured or subdivided, and tested until the region (or regions in the case of multiple faults) of the group of WUTs 26 which includes the faulty programmable interconnect resource is minimized. In other words, the steps of testing and reconfiguring may be repeated until the region of the group of WUTs 26 which includes the faulty interconnect resource cannot be further subdivided.

Figure 8:
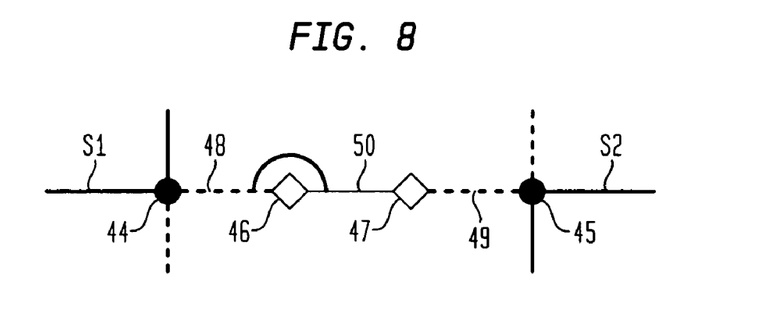
FIG. 8 is an illustration showing a group of interconnect resources used for explanation of the effect of multiple faults on compatibility.

Once it becomes impractical to further subdivide the region of the group of WUTs 26 which includes the faulty interconnect resource, the resources of the FPGA under test 10 are again reconfigured in order to identify a wire $26a_1$, $26a_2$, . . . $26a_n$ of the minimized region of the group of WUTs 26a, for example, which includes the faulty interconnect resource. Specifically as shown in FIG. 8, the wires $26a_1$, $26a_2$, . . . $26a_n$, of the suspect group of WUTs 26a are grouped with additional known fault-free resources to form two subsequent groups of WUTs which are comparatively tested in new testing regions 27a, 27b, . . . 27n in the manner described above. In other words, the steps of testing and reconfiguring may be repeated until the wire (e.g., $26a_1$) of the minimized region of the group of WUTs 26a which includes the faulty interconnect resource is identified.

Once the region of the WUTs is minimized and the wire identified, a variety of testing configurations may be adaptively utilized to identify the faulty interconnect resource within the faulty region of the wire. In order to more precisely identify which interconnect resource, i.e., which wire segment or configuration interconnect point (CIP), within the faulty region is faulty, further reconfiguration and comparative testing is required. These further reconfiguration and comparative testing steps, and the present preferred method of identifying faulty programmable interconnect resources briefly described above, are described in detail for programmable interconnect resources in the above-referenced pending U.S. application Ser. No. 09/994,299 and in C. Stroud ET AL., *On-Line BIST and Diagnosis of FPGA Interconnect Using Roving STARs*, PROC. IEEE INT'L ON-LINE TEST WORKSHOP, 2001.

Once the faulty interconnect resource or resources are identified, a determination is made whether the utilization of the faulty interconnect resources is compatible with the intended operation of the FPGA under test 10. If a determination is made that the faulty resources are compatible with an intended operation of the FPGA under test 10, then the faulty resources continue to function in a diminished, although acceptable, capacity for specific operation modes. If a determination is made that the faulty resources are not compatible with the intended operation of the FPGA under test 10, then the FPGA under test 10, or more specifically, the signal paths containing the identified faulty resources are reconfigured to bypass the faulty interconnect resource for continued operation in a diminished capacity as will be described in greater detail below.

In the present preferred embodiment, a layout of the programmable interconnect resources is defined as a set of positions (e.g., open or closed) for all of its CIPs. If an identified faulty resource does not change the connections intended to be implemented by the layout, then the faulty resource is considered to be compatible with the present layout and the programmable interconnect resources do not need to be reconfigured to bypass the faulty resource.

Figure 7:
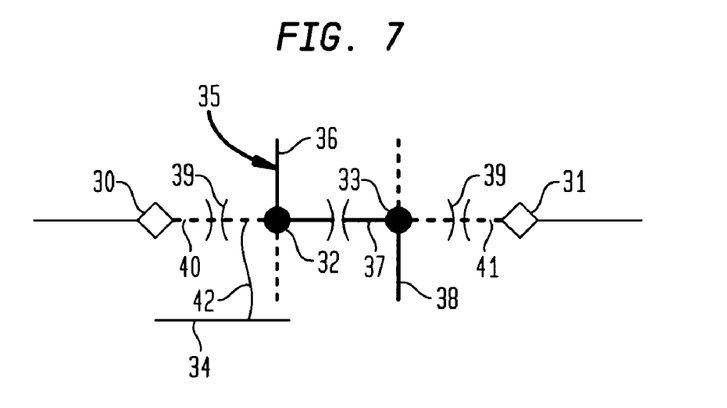
FIG. 7 is an illustration showing a group of interconnect resources used for explanation of fault compatibility with a an FPGA layout.

As shown in FIG. 7, for example, assume one layout or operational configuration of the FPGA under test 10 includes open break-point CIPs 30 and 31 and closed cross-point CIPs 32 and 33. An adjacent wire 34 is unused and a signal path 35 (shown as a bold line covering wires 36, 37 and 38) is routed along wire 36, through cross-point CIP 32, along wire 37, through cross-point 33, and along wire 38. In this configuration, an open 39 in either wire 40 or 41 would be compatible with the signal path 35 as would a short 42 between wire segment 39 and wire 34 because the faulty wire does not change the connections intended to be implemented by the layout. An open in wire 37, on the other hand, cannot be tolerated and is incompatible with the signal path 35 because the faulty wire 37 does change the intended connections of the layout. Compatibility conditions for single faulty interconnect resources are set out below in Table 1.

TABLE 1

Fault Compatibility Conditions

| Type of Faulty Resource | Compatible Condition(s) |
| --- | --- |
| Open Wire Segment or CIP stuck-open | Layout does not use the open resources |
| CIP stuck-closed | Layout uses the CIP or Layout uses only at most one of the shorted segments |
| Short between two Segments | Layout uses only at most one of the shorted segments or Layout uses both shorted segments for the same signal |

If, on the other hand, more than one faulty resource is identified, a model of the programmable interconnect network is preferably modified by the controller 12 to reflect the faulty status of the incompatible faulty resource before determining the compatibility of subsequent faulty resources. In other words, the steps of determining compatibility and modifying the model of the programmable interconnect network are repeated until the compatibility of each of the identified faulty resources is determined. The reason that the model of the programmable interconnect network is modified is that multiple faulty resources can affect whether a faulty resource is compatible with the layout or operational configuration of the FPGA under test 10.

As shown in FIG. 8, for example, assume a layout includes open cross-point CIPs 44 and 45 and closed breakpoint CIPs 46 and 47 and that within the layout wire segment 48 is used by a first signal S1 (shown as a bold line covering) through cross-point CIP 44, wire segment 49 is used by a second signal S2 through cross-point CIP 45, and wire segment 50 between breakpoint CIPs 46 and 47 is unused. A single fault, such as a short between wire segments 48 and 50, would be a compatible fault because breakpoint CIP 47 is open and separates signals S1 and S2 in accordance with the intended operation of the FPGA under test 10. The presence of a second faulty resource such as breakpoint CIP 47 stuck-closed, however, changes whether the first fault is compatible with the layout by allowing the signals S1 and S2 to become shorted through the breakpoint CIP 47.

To appropriately address multiple faulty resources, read/write access to a model of the programmable interconnect network and the layout database which defines the intended operation of the FPGA under test 10, or more specifically, the CIP settings used to route all the signal paths in the operational configuration, is required. From the layout database, all of the segments and CIPs used by a given signal S and the signal routed through a given segment or CIP may be retrieved. Checking for compatibility between a multiple fault $F=[f_1, f_2, \ldots, f_i]$ and the layout is done serially in the present preferred embodiment for every single fault $f_1$ based generally on the contents of Table 1. After each fault is checked, however, the interconnect model is modified to reflect the presence of the fault. In this manner, each additional fault is analyzed with an updated interconnect model.

If the fault is compatible with the layout, the layout database is modified only if the fault affects one of the routed paths. If a determination is made that the faulty resource is not compatible with the layout or the intended operation of the FPGA under test 10, then the FPGA under test 10, or more specifically, the signal paths containing the identified faulty resources are reconfigured to bypass the faulty interconnect resource for continued operation in a diminished capacity.

In the present preferred embodiment, the fault status data for CIPs, i.e., whether each CIP is fault-free, stuck-open, or stuck-closed, is recorded in the layout database. The preferred router correctly uses the fault status data when interconnect signal paths by not using stuck-open CIPs to connect its wire segments or stuck-closed CIPs to separate its segments. These two conditions which may be met by the preferred router allow open wire segments to be modeled by dividing the original segment into two segments separated by an additional stuck-open breakpoint CIP. Similarly, shorted wire segments may be modeled by adding an additional wire segment and two stuck-closed cross-point CIPs between the shorted wire segments.

In accordance with another important aspect of the present invention, the identification of faulty resources and the incorporation of fault status data into the layout database may provide additional opportunities for fault tolerant operation of the FPGA under test 10. For instance, an open wire between two cross-point CIPs allows different signals to be routed through the cross-point CIPs. Under normal fault-free conditions, the wire between the two cross-point CIPs would short the signals routed therethrough preventing different signals from being routed therethrough. To implement this capability, however, a specialized router capable of reading the layout database in which the fault status data is recorded is required. In the present embodiment of the invention, however, the router may be any available commercial router. Since presently available commercial routers are not capable of reading the layout database of an FPGA, dummy signal paths are preferably created to occupy unusable faulty CIPs and wire segments as will be described in more detail below. Although effective, this approach utilizing commercial routers is less flexible than specialized routers.

As indicated above, if a determination is made that the faulty resources are not compatible with the intended operation of the FPGA under test 10, i.e., the identified faulty resource does change the connections intended to be implemented by the layout, then the FPGA under test, or more specifically, the signal paths containing the identified faulty resources are reconfigured to bypass the faulty resource. In accordance with the present invention, a multi-step reconfiguration process is initiated which attempts to minimize the effect of each reconfiguration on the overall performance of the FPGA under test. The steps are preferably applied in order with one exception when the faulty resource is a local interconnect resource which prevents access to a specific input or output pin of a programmable logic block. In this scenario, the first step is skipped.

Thus, the controller first determines whether the faulty resources are local interconnect resources, i.e., programmable interconnect resources connecting other interconnect resources to an input or output of a programmable logic block. If the faulty resources are local interconnect resources, the controller attempts to reconfigure the logic or function of the affected programmable logic blocks and re-route the faulty signal path to connect the faulty signal path with a different input or output of the affected programmable logic block.

Figure 9:
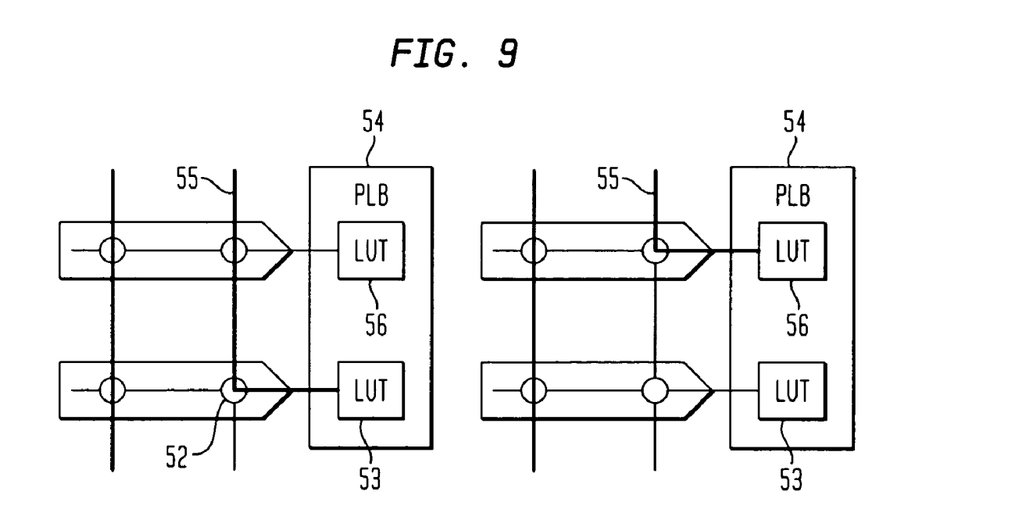
FIG. 9 is an illustration showing a faulty interconnect resource which prevents access to an input of a programmable logic block and the logic block reconfigured to bypass the faulty resource.

FIG. 9, for example, shows a stuck-open CIP 52 which prevents access to an input pin of look-up table (LUT) 53 of programmable logic block 54 along signal path 55. If LUT 56 of the PLB 54 is not being used, then the function performed by LUT 53 may be moved to LUT 56. In this manner, the function performed by the LUT 53 is maintained within the same PLB 54 and is less likely to introduce delays in the signal path. In order to move the function performed by LUT 53 to LUT 56 of PLB 54, the PLB logic is reconfigured and the signal path 55 is re-routed to the inputs and outputs of LUT 56 of PLB 54.

If the controller is unable to reconfigure the affected PLB function and re-route the faulty signal path or if the faulty resources are not local interconnect resources, then the controller attempts to incrementally re-route the faulty signal paths that are affected by an incompatible fault without changing other non-affected signal paths. This is done using programmable interconnect resources of the faulty signal path which are not utilized in dummy signal paths, and unused interconnect resources, or unused programmable logic blocks as route throughs, to enhance routability during this step. In addition, the controller reconfigures the faulty resources to be unutilized during subsequent operation of the FPGA. More specifically, dummy signal paths, briefly described above, are created by the controller which include the faulty resources and each of the interconnect resources between the faulty resource, and a point of intersection in the programmable interconnect network, or an input or output of the FPGA. The dummy signal paths are unavailable for subsequent utilization by the FPGA.

Figure 10:
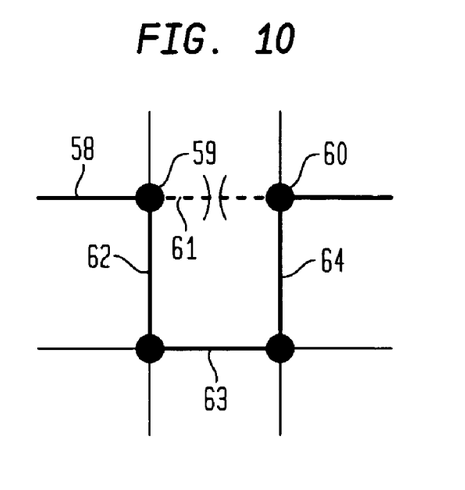
FIG. 10 is an illustration showing the re-routing of a signal path around an identified faulty interconnect resource.

The controller then attempts to incrementally re-route signal paths that are affected by incompatible faults without changing the route of other non-affected signal paths, if possible. This is possible if, for example, the faulty resource is located in an uncongested global area or a bypassable local area. As shown in FIG. 10, for example, a signal path originally routed directly through two CIPs 59 and 60 may be incrementally re-routed around an open faulty wire 61 between the CIPs using previously unused resources 62, 63, and 64.

In order to re-route the signal paths affected by incompatible faults, each of the affected signal paths are ripped-up in all directions starting at the fault site until a point with three or more branches of the affected signal path is reached. At this point, dummy signal paths are created using the faulty resources in order to prevent their use in the incremental re-routing of these and other affected signal paths. Then the affected signal paths are all routed using unused interconnect resources and unused programmable logic blocks as route throughs to enhance routability during this step. Once the affected signal paths are re-routed to avoid the identified faulty resources, compatibility with each self-testing area position must be determined. If the re-routed signal paths are compatible, then fault tolerant reconfiguration is stopped at this step.

In congested or heavily utilized areas of the FPGA under test 10, the local layout transformations described immediately above may be insufficient to bypass all of the incompatible faults. In this scenario, a more global transformation may be utilized. Specifically, a variable sized region around each of the faulty resources is re-routed. In other words, each of the signal paths routed through the variable sized region are incrementally re-routed. If there are insufficient resources available in the variable sized area to successfully re-route each of the signal paths, then the size of the variable sized area is incremented and each of the signal paths are again rerouted. These steps may be repeated until substantially all of the resources of the working area of the FPGA under test are utilized.

If re-routing even at the boundaries of the FPGA under test 10 is unsuccessful in re-routing each of the signal paths, then further reconfiguration via partial incremental global placement of resources is initiated. In this step, resources which need to be reached by currently unrouted signal paths may be relocated to new locations previously occupied by spare resources or compatible PLBs. All of the remaining unrouted signal paths are handled at once by considering each of the resources attached to these signal paths as a group. To assign resources to be moved to available positions, a matching strategy is used that minimizes the total distance between sources and sinks. Alternatively, cells attached to signals in the precomputed critical path may be considered first by minimizing the distance the cells in the in the critical path are moved in order to minimize performance degradation. When a PLB is moved, all its signal paths are ripped-up and are added to the unrouted set.

If all of the remaining faulty signal paths and additional signal paths routed through the region of the FPGA are not successfully re-routed utilizing re-assignments, then the size of the re-assignment region may be incrementally increased and the controller again attempts to re-assign and re-route the remaining unrouted faulty signal paths and additional signal paths routed through the region. These steps may be repeated until each of the remaining faulty signal paths are successfully re-routed utilizing re-assignments or the region of the FPGA includes substantially all of the resources of the working area of the FPGA under test 10.

In still another aspect of the present invention, at least a portion of the function of the FPGA may be re-mapped by the controller. In this stage, system remapping is performed within a variable sized area. The area is initially defined as the smallest area that encompasses all of the PLBs on all of the unrouted signal paths. In the event that some signal paths remain unrouted, the size of the variable sized area is incrementally increased until the area encompasses the entire FPGA under test 10. When the area encompasses the entire FPGA under test 10, global remapping is accomplished by placing and routing the entire system function. All faulty resources are marked as unusable and the self-testing area is reserved. Then, the system function is routed with no preallocated spare resources in place. If the global remapping is successful, then spare resources may be incrementally reinserted for future fault tolerant use. If the global remapping is unsuccessful, the resources must be taken from the self-testing area.

More specifically, the controller may utilize programmable interconnect resources and/or PLBs of the FPGA under test 10 positioned within the self-testing area 16 to assist the re-routing of the remaining faulty signal paths if all of the remaining faulty signal paths have not been successfully re-routed around the faulty interconnect resources at this point. Although utilizing the resources in the self-testing area 16 for continued operation of the FPGA under test 10 diminishes the ability of the self-testing area to test, and identify faulty resources, this approach allows the FPGA under test to continue to operate although in a diminished capacity.

Figure 11:
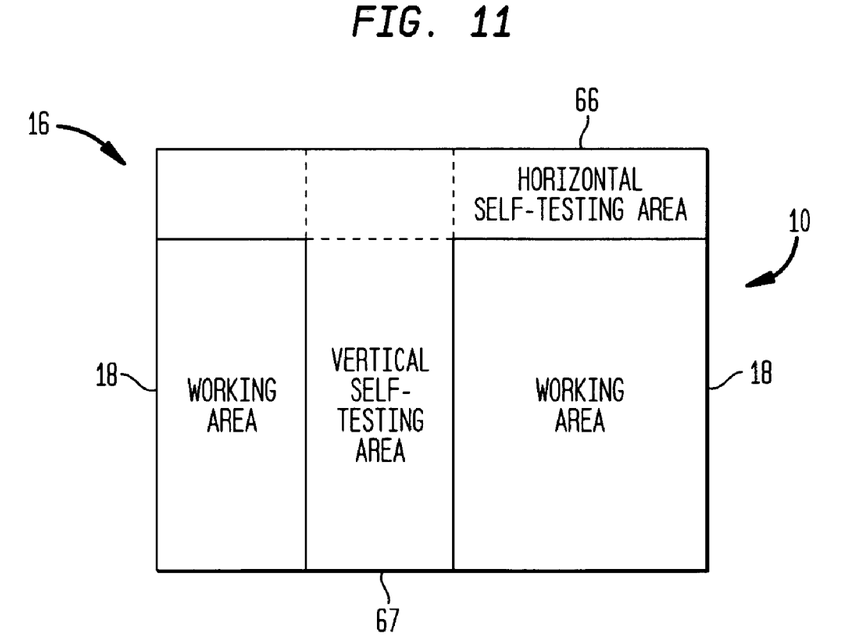
FIG. 11 is an illustration of the preferred FPGA under test with the initial self-testing area subdivided into a vertical self-testing area and an horizontal self-testing area.

In accordance with the preferred method of the present invention, the initial self-testing area 16 of the FPGA under test 10 may be divided into a vertical self-testing area 66 and an horizontal self-testing area 67 as shown in FIG. 11. In this manner, the steps of determining whether utilization of the faulty interconnect resources is compatible with the intended operation of the FPGA under test 10 and reconfiguration of the interconnect resources including the utilization of the faulty interconnect resources may be performed prior to a subsequent roving step of a first, or vertical self-testing area 66, wherein the faulty interconnect resources are identified, while the remaining, or horizontal self-testing area 67 may continue the steps of roving, testing, identifying and determining the compatibility of faulty interconnect resources within the self-testing area until another faulty interconnect resource is identified.

Upon completion of testing of each of the FPGA resources within the initial self-testing areas 66 or 67, identifying the faulty interconnect resource(s), and determining whether the faulty interconnect resource(s) are compatible with the intended operation of the FPGA under test 10 and reconfiguring the FPGA under test, if required, the FPGA under test 10 is further reconfigured such that the functions of the PLBs forming a portion of the working area 18 are copied to the PLBs forming the initial self-testing areas 66 or 67 and the programmable interconnect resources appropriately re-routed. Once completed, the copied portion of the working area becomes a subsequent self-testing area. Preferably, the initial self-testing areas 66 or 67 are reconfigured as an adjacent portion of the working area, i.e., the programmed function of an adjacent portion of the working area is relocated or more specifically, copied to the initial self-testing areas 66 or 67, and the adjacent portion of the working area is reconfigured as the subsequent self-testing area. The present preferred method of roving the independent self-testing areas and reconfiguring the FPGA under test 10 is described in detail in the above-referenced U.S. Pat. No. 6,550,030 and in M. ABRAMOVICI ET AL., *Using Roving STARs for On-Line Testing and Diagnosis of FPGAs in Fault-Tolerant Applications*, PROC. INTN'L TEST CONF., pp. 973–982, 1999 incorporated herein by reference.

In accordance with another aspect of the present inventive method, the programmable interconnect resources of subsequent self-testing areas are similarly tested, faulty resources identified, their compatibility determined, and the FPGA under test reconfigured, if required, as described above for the initial self-testing area 16 until each portion of the FPGA under test 10 is reconfigured as a subsequent self-testing area. In other words, the self-testing area may continuously rove around the FPGA under test 10 repeating the steps of configuring, testing, and identifying so long as the FPGA under test 10 is in operation. Advantageously, normal operation of the FPGA under test 10 continues uninterrupted by the testing conducted within the self-testing areas.

In summary, the method of fault tolerant operation of a FPGA during normal on-line operation is carried out during normal on-line operation of an FPGA under test 10 by configuring FPGA resources into a working area 18 and a self-testing area 16. The working area 18 maintains normal operation of the FPGA 10 throughout testing. Within the initial and subsequent self-testing areas, however, the FPGA interconnect resources are reconfigured as testers 19 which include groups of wires under test 24. The groups of wires under test 24 are comparatively tested to determine whether a fault exists within either of the groups of wires under test 24. The FPGA resources within the group of wires under test 24 identified to include a faulty interconnect resource(s) are reconfigured and further tested until the faulty wire(s) and/or configurable interconnect point(s) are identified. Once identified, a determination is made whether utilization of the faulty programmable interconnect resource is compatible with an intended operation of the FGPA under test 10. If the fault is compatible, the FPGA under test 10 is allowed to operate in a fault tolerant manner. If the fault is not compatible, the FPGA under test 10 is reconfigured so as not to utilize the faulty interconnect resource during operation.

The foregoing description of a preferred embodiment of the present invention has been presented for purposes of illustration and description. It is not intended to be exhaustive or to limit the invention to the precise form disclosed. Obvious modifications or variations are possible in light of the above teachings. In one alternate embodiment, for example, the controller may allocate programmable interconnect resources as spares which may be utilized by the controller in any of the re-routing steps. Although the preferred method does not require the preallocation of spare interconnect resources since an FPGA will typically have many unused interconnect resources, an optional spare interconnect resource preallocation strategy to evenly distribute the spare interconnect resources across the FPGA may be beneficial. Specifically, the addition of spare interconnect resources will increase the likelihood of having usable resources in the vicinity of the fault, which in turn will reduce fault avoidance reconfiguration time, increase the probability of successful incremental routing, and minimize the impact of reconfiguration on non-faulty signal paths. It should be noted, however, that pre-allocating spare interconnect resources also has disadvantages. There is an inherent increase in the initial circuit place and route time, and circuit performance is also degraded.

In the present alternative, the spare resource preallocation strategy is based on routing a set of dummy signal paths that are evenly distributed across the FPGA under test 10. To accomplish this, a spare PLB preallocation strategy which is described in U.S. patent application Ser. No. 09/611,449 is utilized. In this alternate embodiment, spare PLBs are initially evenly distributed across the working area of the FPGA under test in repeating patterns so their inputs and outputs may be used as sinks and sources (respectively) for dummy signal paths. Dummy logic functions which use all of the PLB inputs and outputs are then programmed into all of the locations of the spare PLBs.

Next, a parameterized set of dummy signal paths that connect the PLB inputs and outputs of the dummy logic functions are assigned. The parameters controlling the creation of the dummy signal paths are a triple (o, d, m). The variable o controls the number of outputs used in each PLB to drive signal paths, the variable d controls the propagation direction of the dummy signal paths, and the variable d provides a degree of freedom. An output of a dummy logic function can drive a signal path that propagates outward in one to four directions: N, E, S, and W. Thus, a value of d may be defined as an element of [N, E, S, or W] or as any combination of the elements of the set [N, E, S, or W]. The value of d may also be varied from source PLB to source PLB, and from source PLB output to source PLB output. If the circuit cannot be routed, a value of d selected that has fewer directions. For example one value of d could include the directions N and E. If this value cannot be routed, then a value of d that has fewer directions, like N, is selected. The variable m describes the number of dummy signal net sinks in each direction described by d. In the present alternate embodiment, spare are selected such that they are closest to the source spare (in the directions defined by d) as sinks.

Next, the dummy signals are routed in accordance with the above-noted definition. Preferably, this is accomplished using a specialized router that allows control of which interconnect resources are reserved, i.e., short segments or long segments, for spares. Alternatively, we can create a script that reserves all the interconnect resources except the ones we want a standard router to use for a particular route. If the system function will not route at this point, the number of interconnect resources reserved must be reduced by reducing o or/and m and finally, the dummy logic and signals are removed, leaving the logic and interconnect spares available for fault bypassing.

In accordance with the broad teaching of the present invention, there are other alternate embodiments wherein the fault tolerant methods described herein may be applied in part or in whole to an embedded FPGA portion(s) of a system-on-chip or any application specific integrated circuit. Further, the on-line fault tolerant methods may also be applied off-line during manufacturing testing, for example. During off-line testing, the entire FPGA may be configured as a testing area, or preferably, several testing areas for testing and fault tolerant operation as described above for on-line fault tolerant operation.

The preferred embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fault tolerant operation of a field programmable gate array during normal on-line operation comprising the steps of:
   configuring said field programmable gate array into a self-testing area and a working area, said working area maintaining normal operation of the field programmable gate array;
   identifying at least one faulty programmable interconnect resource of a programmable interconnect network utilized in at least one of a plurality of signal paths and positioned within said self-testing area;
   determining whether utilization of said faulty programmable interconnect resource is compatible with an intended operation of the field programmable gate array; and
   reconfiguring at least a portion of programmable interconnect resources, including the utilization of said at least one faulty programmable interconnect resource, if said at least one faulty programmable interconnect resource is not compatible with the intended operation of the field programmable gate array,
   whereby said at least one faulty programmable interconnect resource may be utilized within operating configurations which are compatible with the intended operation of the field programmable gate array to provide fault tolerant operation of the field programmable gate array.

2. The method of fault tolerant operation of a field programmable gate array set forth in claim 1, wherein the step of identifying said at least one faulty programmable interconnect resource includes testing at least one programmable interconnect resource within said self-testing area.

3. The method of fault tolerant operation of a field programmable gate array set forth in claim 2, further comprising the step of roving said self-testing area by reconfiguring the field programmable gate array such that a portion of the working area becomes a subsequent self-testing area and at least a portion of the initial self-testing area becomes a portion of the working area.

4. The method of fault tolerant operation of a field programmable gate array set forth in claim 3, wherein said self-testing area includes at least two independent roving self-testing areas; and wherein the steps of determining whether utilization of said at least one faulty programmable interconnect resource is compatible with an intended operation of the field programmable gate array and reconfiguring at least a portion of the programmable interconnect resources including the utilization of said at least one faulty interconnect resource are performed prior to a subsequent roving step of a first of said at least two independent self-testing areas wherein said at least one faulty programmable interconnect resource is identified.

5. The method of fault tolerant operation of a field programmable gate array set forth in claim 4, wherein the remaining independent self-testing area continues the steps of roving, testing, and identifying until at least one faulty programmable interconnect resource is identified while the steps of determining whether utilization of said at least one faulty programmable interconnect resource is compatible with an intended operation of the field programmable gate array and reconfiguring at least a portion of the programmable interconnect resources including the utilization of said at least one faulty interconnect resource are performed within said first independent self-testing area.

6. The method of fault tolerant operation of a field programmable gate array set forth in claim 1, wherein the faulty programmable interconnect resource is reconfigured to be unutilized during operation of the field programmable gate array if said faulty programmable interconnect resource is incompatible with the intended operation of the field programmable gate array.

7. The method of fault tolerant operation of a field programmable gate array set forth in claim 6, further comprising the step of modifying a model of the programmable interconnect network if said at least one faulty programmable interconnect resource is determined to be incompatible with the intended operation of the field programmable gate array.

8. The method of fault tolerant operation of a field programmable gate array set forth in claim 7, wherein at least two faulty programmable interconnect resources are identified, and the steps of determining compatibility and modifying a model of the programmable interconnect network are repeated until each of said faulty programmable interconnect resources are reconfigured.

9. The method of fault tolerant operation of a field programmable gate array set forth in claim 1, wherein the field programmable gate array is an embedded component of a system-on-chip or integrated circuit.

10. The method of fault tolerant operation of a field programmable gate array set forth in claim 1, wherein the step of identifying at least one faulty programmable interconnect resource includes determining whether the at least one faulty programmable interconnect resource is a local programmable interconnect resource connecting at least one of said plurality of signal paths containing the at least one faulty programmable interconnect resource to an input or output of a programmable logic block; and wherein the step of reconfiguring at least a portion of the programmable interconnect resources including the utilization of the at least one faulty interconnect resource includes reconfiguring the function of the programmable logic block and re-routing the at least one faulty signal path to connect the at least one faulty signal path to a different input or output of the programmable logic block if the at least one faulty programmable interconnect resource is a local programmable interconnect resource.

11. The method of fault tolerant operation of a field programmable gate array set forth in claim 10, wherein the step of reconfiguring at least a portion of the programmable interconnect resources including the utilization of the faulty programmable interconnect resource includes creating a dummy signal path, including the at least one faulty programmable interconnect resource and each of the programmable interconnect resources between the at least one faulty programmable interconnect resource, and a point of intersection in the programmable interconnect network or an input or output of the field programmable gate array, which is unavailable for subsequent utilization by the field programmable gate array if the at least one faulty programmable interconnect resource is not a local programmable interconnect resource.

12. The method of fault tolerant operation of a field programmable gate array set forth in claim 11, wherein the step of reconfiguring at least a portion of programmable interconnect resources includes re-routing the at least one faulty signal path utilizing programmable interconnect resources of the faulty signal path not utilized in the at least one dummy signal path, and at least one of additional programmable interconnect resources and programmable logic blocks not contained within one of said plurality of signal paths or the at least one dummy signal path.

13. The method of fault tolerant operation of a field programmable gate array set forth in claim 12, wherein the step of reconfiguring at least a portion of programmable interconnect resources includes re-routing remaining unrouted faulty signal paths and additional signal paths routed through a region of the field programmable gate array around the at least one faulty programmable interconnect resource utilizing programmable interconnect resources and programmable logic blocks positioned within said region and not utilized in the at least one dummy signal path.

14. The method of fault tolerant operation of a field programmable gate array set forth in claim 13, wherein the step of reconfiguring at least a portion of programmable interconnect resources includes incrementally increasing a size of said region if the step of re-routing the remaining faulty signal paths and additional signal paths routed through the region of the field programmable gate array is unsuccessful; and repeating the re-routing and incremental increasing steps until each of the remaining faulty signal paths are successfully re-routed or the region of the field programmable gate array includes substantially all of the resources of the working area of the field programmable gate array.

15. The method of fault tolerant operation of a field programmable gate array set forth in claim 14, wherein the step of reconfiguring at least a portion of programmable interconnect resources includes re-assigning the function of programmable logic blocks attached to the remaining faulty signal paths to unused programmable logic blocks, and re-routing the remaining faulty signal paths around the at least one faulty programmable interconnect resource utilizing the unused programmable logic blocks and programmable interconnect resources not utilized in the at least one dummy signal path.

16. The method of fault tolerant operation of a field programmable gate array set forth in claim 15, wherein the step of reconfiguring at least a portion of programmable interconnect resources further includes repeating the re-assigning and re-routing steps until each of the remaining faulty signal paths are successfully re-routed or all possible re-assignments have been exhausted.

17. The method of fault tolerant operation of a field programmable gate array set forth in claim 15, wherein the step of reconfiguring at least a portion of programmable interconnect resources includes remapping at least a portion of the function of the field programmable gate array in a region of the field programmable gate array including all of the programmable logic blocks attached to the remaining faulty signal paths and additional signal paths passing through the re-mapped region utilizing programmable interconnect resources and programmable logic blocks positioned within said region and not utilized in the at least one dummy signal path.

18. The method of fault tolerant operation of a field programmable gate array set forth in claim 17, wherein the step of remapping at least a portion of the function of the field programmable gate array further includes incrementally increasing a size of said remapping region if the step of remapping is unsuccessful for at least one of the remaining faulty signal paths; and repeating the remapping and incremental increasing steps until each of the remaining faulty signal paths are successfully re-mapped or the remapping region of the field programmable gate array includes substantially all of the resources of the working area of the field programmable gate array.

19. The method of fault tolerant operation of a field programmable gate array set forth in claim 18, wherein the step of reconfiguring at least a portion of programmable interconnect resources includes utilizing at least one programmable interconnect resource or programmable logic block of the field programmable gate array positioned within said self-testing area after substantially exhausting said working area unused programmable interconnect resources or programmable logic blocks, and re-routing the remaining faulty signal paths utilizing at least one of programmable interconnect resources and programmable logic blocks positioned within said self-testing area and not utilized in the at least one dummy signal path after substantially exhausting resources in said working area.

20. The method of fault tolerant operation of a field programmable gate array set forth in claim 12, further comprising the step of roving said self-testing area by reconfiguring the field programmable gate array such that a portion of the working area becomes a subsequent self-testing area and at least a portion of the initial self-testing area becomes a portion of the working area; and determining the compatibility of the at least one re-routed signal path with each self-testing area configuration.

21. The method of fault tolerant operation of a field programmable gate array set forth in claim 13, wherein at least two faulty programmable interconnect resources are identified and the region of the field programmable gate array includes the at least two faulty programmable interconnect resources if one or more of the faulty programmable interconnect resources are spatially close.

22. The method of fault tolerant operation of a field programmable gate array set forth in claim 1, further comprising allocating programmable interconnect resources as spares.

23. The method of fault tolerant operation of a field programmable gate array set forth in claim 22, wherein said allocating step includes allocating at least two programmable logic blocks as spares, and routing at least one spare signal path between inputs and outputs of said spare programmable logic blocks.

24. The method of fault tolerant operation of a field programmable gate array set forth in claim 23, wherein the at least one spare signal path includes a plurality of substantially evenly distributed spare signal paths.

25. A method of fault tolerant operation of a field programmable gate array during normal on-line operation comprising the steps of:

configuring said field programmable gate array into at least two independent roving self-testing areas and a working area, said working area maintaining normal operation of the field programmable gate array;

testing at least one faulty programmable interconnect resource positioned within at least one of said self-testing areas;

determining whether utilization of said faulty programmable interconnect resource is compatible with an intended operation of the field programmable gate array; and reconfiguring the utilization of said at least one faulty programmable interconnect resource to be unutilized during operation of the field programmable gate array if said at least one faulty programmable interconnect resource is not compatible with the intended operation of the field programmable gate array, whereby said at least one faulty programmable interconnect resource may be utilized within operating configurations which are compatible with the intended operation of the field programmable gate array to provide fault tolerant operation of the field programmable gate array.

26. The method of fault tolerant operation of a field programmable gate array set forth in claim 25, wherein the determining and reconfiguring steps are performed prior to a subsequent roving step of a first of said at least two self-testing areas wherein said at least one faulty programmable interconnect resource is identified; and wherein the remaining self-testing area continues the steps of roving and testing until at least one faulty programmable interconnect resource is identified.

27. The method of fault tolerant operation of a field programmable gate array set forth in claim 26, further comprising the step of modifying a model of the programmable interconnect network if said at least one faulty programmable interconnect resource is determined to be incompatible with the intended operation of the field programmable gate array prior to repeating the step of determining whether utilization of a second identified faulty programmable interconnect resource is compatible with an intended operation of the field programmable gate array.

28. The method of fault tolerant operation of a field programmable gate array set forth in claim 27, further comprising the steps re-routing a signal path originally containing the faulty programmable interconnect resource utilizing non-faulty programmable interconnect resources of the faulty signal path, and at least one of additional unused programmable interconnect resources and programmable logic blocks; and determining the compatibility of the re-routed signal path with each self-testing area configuration.

29. An apparatus for supporting fault tolerant on-line operation of a field programmable gate array comprising:

a controller in communication with the field programmable gate array for: (a) configuring the field programmable gate array into a self-testing area and a working area, the working area maintaining normal operation of the field programmable gate array; (b) initiating the identification of at least one faulty programmable interconnect resource utilized in at least one of a plurality of signal paths and positioned within said self-testing area; (c) determining whether utilization of said at least one identified faulty resource is compatible with an intended operation of the field programmable gate array; and (d) reconfiguring at least a portion of the programmable interconnect resources including the utilization of said at least one faulty programmable interconnect resource if the at least one faulty programmable interconnect resource is not compatible with the intended operation of the field programmable gate array.

30. The apparatus for supporting fault tolerant on-line operation of the field programmable gate array of claim 29, further comprising a storage medium in communication with said controller for storing a model of the programmable interconnect network; and wherein said controller modifies the model of the programmable interconnect network if said at least one faulty programmable interconnect resource is determined to be incompatible with the intended operation of the field programmable gate array prior to determining whether utilization of a next identified faulty resource is compatible with an intended operation of the field programmable gate array.

31. The apparatus for supporting fault tolerant on-line operation of the field programmable gate array of claim 29, wherein the field programmable gate array is an embedded component of a system-on-chip or integrated circuit.

32. A method of fault tolerant operation of a field programmable gate comprising the steps of:

configuring said field programmable gate array for testing;

identifying at least one faulty programmable interconnect resource of a programmable interconnect network utilized in at least one of a plurality of signal paths during normal operation;

determining whether utilization of said faulty programmable interconnect resource is compatible with an intended operation of the field programmable gate array; and reconfiguring at least a portion of programmable interconnect resources, including the utilization of said at least one faulty programmable interconnect resource, if said at least one faulty programmable interconnect resource is not compatible with the intended operation of the field programmable gate array.

33. The method of fault tolerant operation of a field programmable gate array set forth in claim 32, wherein the field programmable gate array is an embedded component of a system-on-chip or integrated circuit; and wherein the step of identifying said at least one faulty programmable interconnect resource includes testing at least one programmable interconnect resource within said self-testing area.

34. The method of fault tolerant operation of a field programmable gate array set forth in claim 32, wherein the faulty programmable interconnect resource is reconfigured to be unutilized during operation of the field programmable gate array if said faulty programmable interconnect resource is incompatible with the intended operation of the field programmable gate array.

35. The method of fault tolerant operation of a field programmable gate array set forth in claim 32, further comprising the step of modifying a model of the programmable interconnect network if said at least one faulty programmable interconnect resource is determined to be incompatible with the intended operation of the field programmable gate array.

36. The method of fault tolerant operation of a field programmable gate array set forth in claim 35, wherein at least two faulty programmable interconnect resources are identified, and the steps of determining compatibility and modifying a model of the programmable interconnect network are repeated until each of said faulty programmable interconnect resources are reconfigured.

* * * * *